SOLID STATE RELAY

Filed Nov. 27, 1963

INVENTORS,
H. E. PUCKETT
JOHN L. MATTHEWS
JAMES C. HENDERSON
BY Bernard Olcott
ATTORNEY INVENTORS,
H. E. PUCKETT
JOHN L. MATTHEWS
JAMES C. HENDERSON
BY Bernard Olcott
ATTORNEY Nov. 15, 1966 H. E. PUCKETT ETAL 3,286,030

SOLID STATE RELAY

Filed Nov. 27, 1963 3 Sheets-Sheet 3

INVENTORS,
H. E. PUCKETT
JOHN L. MATTHEWS
JAMES C. HENDERSON

BY Bernard Olcott

ATTORNEY

United States Patent Office 3,286,030
Patented Nov. 15, 1966

3,286,030
SOLID STATE RELAY

Hillard E. Puckett and John L. Matthews, Orlando, and James C. Henderson, Winter Park, Fla., assignors to Ortronix, Inc., Orlando, Fla., a corporation of Florida
Filed Nov. 27, 1963, Ser. No. 329,337
22 Claims. (Cl. 178—70)

This invention relates to relays employing solid state devices instead of mechanical armatures moved by magnets and in particular to an improved solid state relay for universal high speed use in communications or data processing systems employing a series of informational pulses.

While station equipment can generally employ "neutral" type signals with attendant advantage associated with simpler circuitry, there is a preference for using "polar" type signals for transmission lines between stations. Specifically, the "push-pull" characteristic of polar signals results in an improved signal to noise ratio.

Since solid state devices, such as diodes and transistors have a much longer operating life than mechanical contacts, an all electronic solid state relay is very desirable to reduce maintenance costs, especially in systems employing very large numbers of relays.

It is an object of the invention to provide an improved all electronic solid state relay which can receive "neutral" or "polar" signals generally employed in teletypewriter systems and repeat the intelligence upon outgoing lines in either "neutral" or "polar" type signals.

It is another object of the invention to provide an improved all electronic solid state relay which has an output "single-pole-double-throw" switching characteristic.

It is still another object of the invention to provide an improved all electronic solid state relay which employs a bias current from a local battery so that the width of the signal pulses can be adjusted in the manner that similar adjustments are made when the usual mechanical relays are used.

It is still another object of the invention to provide an improved all electronic solid state relay which can be a universal replacement with longer operating life in circuits now employing the usual type of mechanical relay having a signal input and a bias current input and an output single-pole-double-throw switching characteristic.

It is still another object of the invention to provide an improved all electronic solid state relay with a pair of output circuits having a selectively delayed closure characteristic relative to each other so that both output circuits cannot be simultaneously closed in any part of the switching cycle.

In accordance with a broad concept of invention there is provided a relay which comprises a first and second input, a first D.C. to D.C. converter having an input coupled to the first relay input, a second D.C. to D.C. converter having an input coupled to the second relay input and a first and second impedance device each having a high and low impedance state connected in controllable relationship to an output of the first and second D.C. to D.C. converters, respectively.

In a particularly useful embodiment of the invention there is also provided a first means controlled by the first D.C. to D.C. converter to place the second device in a high impedance state until the input on the second relay input exceeds a predetermined threshold value, and a second means controlled by the second D.C. to D.C. converter to place the first device in a high impedance state whenever the second device is placed in a low impedance state.

In another particularly useful embodiment of the invention there is also provided means delaying the changing of impedance state of each device from a high impedance to a low impedance when the other device is about to change from a low impedance to a high impedance state to thereby provide a minimum selected time interval during which both devices are in a high impedance state.

Other objects and features of the present invention will be set forth or apparent in the following description and claims and illustrated in the accompanying drawings, which disclose by way of example, and not by way of limitation, in a limited number of embodiments, the principal of the invention and structural implementations of the inventive concept.

In the drawings, in which like reference numbers designate like compoents in the several views.

Figure 1:
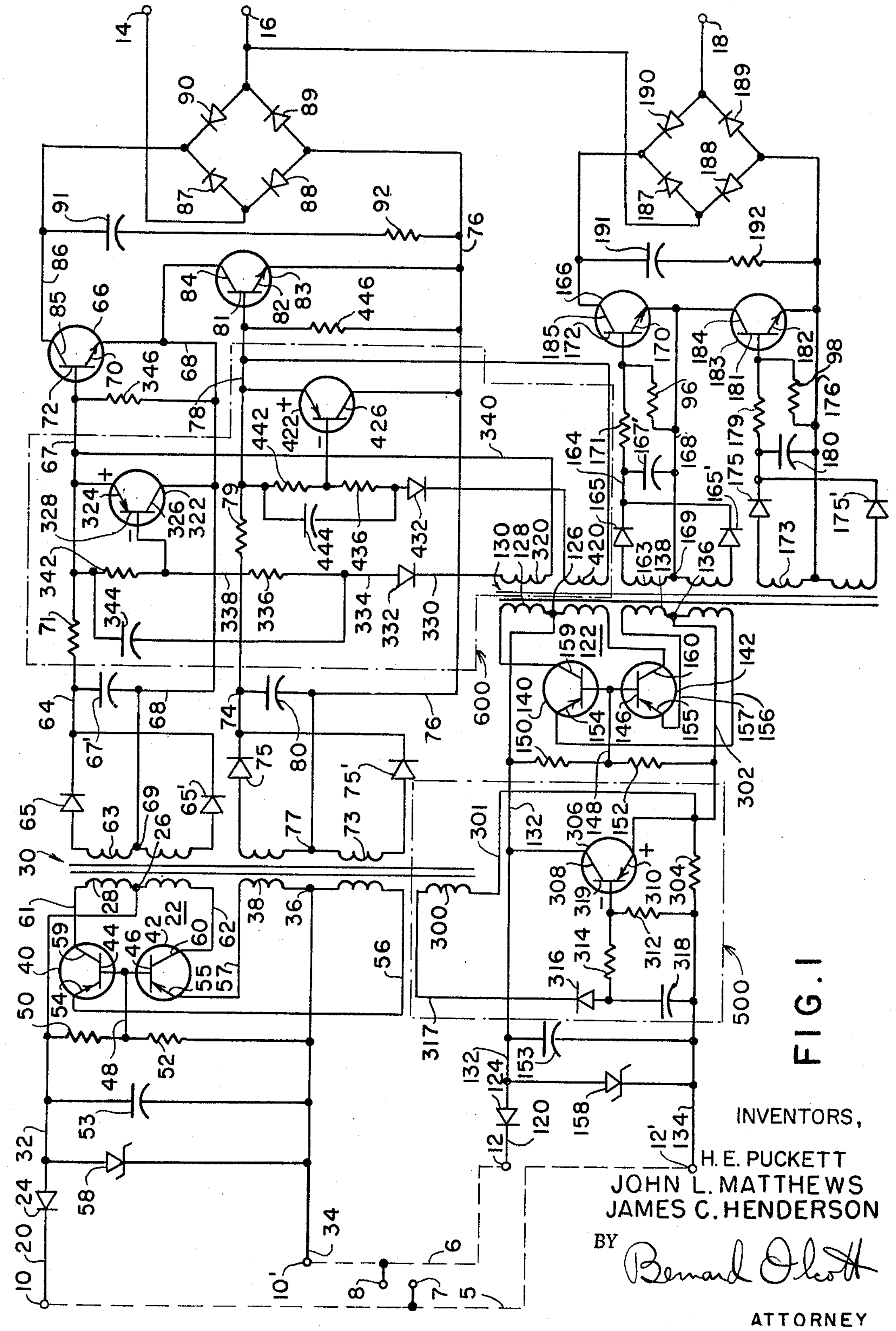
FIGURE 1 is a schematic diagram of a universal solid state relay according to the invention.

In FIGURE 1, a solid state relay has two pairs of input terminals 10, 10′ and 12, 12′, respectively, controlling a three terminal output 14, 16 and 18 having a single-pole-double-throw characteristic, the terminal 16 representing the common contact which is normally movable on the usual mechanical type of telegraph relay.

For "neutral" input signals, either pair of input terminals 10, 10′ or 12, 12′ can be connected to a source of D.C. bias current which is normally available to provide a selected threshold for changing the state of closure of the relay. In FIGURE 1, it will be assumed that the D.C. bias current is connected to inputs 10, 10′. The solid state relay schematically illustrated in FIGURE 1 is intended to replace the prior art type of electromechanical relay in both neutral and polar teletypewriter circuits, it being understood that the prior art electromechanical relay is capable of receiving either neutral or polar signals and of having a "double-throw-single-pole" output switching characteristic for selectively providing either neutral or polar output signals. In FIGURE 1, and similar to such prior art electromechanical relay, one pair of inputs 10, 10′ is connectable to a D.C. bias source (not shown) for controlling the "pull-in" theshold of the relay. The second pair of input terminals 12, 12′ is connectable to receive teletypewriter signals in coded series of pulses, one of such pulses A being illustrated in FIGURE 2 as having a maximum amplitude of $-w$ milliamperes, the negative polarity of the incoming signal A being applied to terminal 12. A selective bias current (controllable by apparatus not shown), is applied to terminals 10, 10′ with the negative polarity of the bias current applied to terminal 10. With no input signal applied to terminals 12 and 12′, output terminals 14 and 16 remain in the "closed" or "shorted" position as a consequence of the input bias current while output terminals 16 and 18 remain "open." The bias current flowing in input terminals 10, 10′ establishes the "pull-in" threshold shown in FIGURE 2 as H. So long as the input signal remains below H, terminals 14 and 16 remain "closed" and terminals 16 and 18 remain "open."

As soon as the input signal A exceeds the threshold of H, terminals 14 and 16 "open" and terminals 16 and 18 "close" in the desired "double-throw-single-pole" switching characteristic.

A lead 20 connects input terminal 10 to an oscillator 22 through a diode 24 which is selectively poled so that the negative signal on terminal 10 is conducted to the center tap 26 of a primary winding 28 of transformer 30 in oscillator 22 via a lead 32. A lead 34 connects terminal 10' to a center tap 36 of an input winding 38 on transformer 30 of the oscillator 22. Oscillator 22 comprises two transistors 40, 42 connected in "push-pull." The base electrode 44 of transistor 40 is connected to the base electrode 46 of transistor 42, the common junction being connected via a lead 48 to the junction of two resistors 50, 52 which have their other ends connected to leads 32 and 34 respectively and a capacitor 53. Emitter 54 of transistor 40 and emitter 55 of transistor 42 are connected to the outside ends of input winding 38 of transformer 30 by leads 56 and 57. A diode 58 is connected in series with the diode 24 across terminals 10 and 10', the diode 58 being oppositely poled to diode 24 in such circuit. Diode 58 is a voltage limiter as a consequence of its zener reverse breakdown characteristic to protect the oscillator 22 from excessive input bias voltage. Collector 59 of transistor 40 and collector 60 of transistor 42 are connected to the outside ends of the output winding 28 of transformer 30 by leads 61 and 62 respectively.

The outside ends of a secondary winding 63 of transformer 30 are connected together to a common lead 64 thru a pair of diodes 65, 65' poled away from winding 63 so that lead 64 will be positive. Diodes 65, 65' rectify one output of oscillator 22 for providing a saturating D.C. bias voltage for saturable transistor 66 through a filter comprising a capacitor 67' connected between lead 64 and a lead 68, the latter being connected between a center tap 69 of winding 63 for conducting a negative polarity to the emitter 70 of saturable transistor 66. A resistor 71 connected at one end to lead 64 acts as a filter in conjunction with capacitor 67', the other end of 71 connecting base electrode 72 of saturable transistor 66 to a filtered positive D.C. voltage via lead 67. The input circuit to saturable transistor 66 is selectively adjusted so that a small amount of bias current, say 10 milliamperes, through terminals 10, 10' will adequately energize oscillator 22 for producing an output sufficient to saturate transistor 66.

A second secondary winding 73 in the transformer 30 of oscillator 22 is connected at each end to a common lead 74 through individual diodes 75, 75' which are poled to give lead 74 a positive polarity. A lead 76 connected to center tap 77 of winding 73 provides a negative polarity in respect of lead 74, the latter being connected to lead 78 through a filter resistor 79. A capacitor 80 connected across leads 74 and 76 completes the filter.

Positive and negative leads 78 and 76 are connected to base electrode 81 and emitter 82, respectively, of a saturable transistor 83, the collector electrode 84 of the latter being connected to lead 68. The input to the transistor 83 is selectively adjusted so that the output of oscillator 22 which saturates transistor 66 will also saturate transistor 83. The output electrodes 85, 70, 84, 82 of saturable transistors 66 and 83 are connected in series relative to leads 86 and 76 and a conductance path is provided from output terminal 14 to either leads 86 or 76 through one of the oppositely poled diodes 87 or 88 depending on whether a positive or a negative terminal of a battery (not shown) in the output circuit to the relay (not shown) is connected to terminal 14. Similarly, a low impedance circuit is provided from output terminal 16 to the other one of the leads 86 or 76 through oppositely poled diodes 89 or 90. Accordingly, when transistors 66 and 83 are saturated by the output of oscillator 22, the impedance between output terminals 14 and 16 is greatly reduced to simulate relay contacts which are normally closed by the bias current flowing in input terminals 10, 10'. The unsaturated state of transistors 66 and 83 represent the "open" state between terminals 14 and 16. A capacitor 91 in series with a resistor 92 is connected between leads 86 and 76 to provide an energy dissipation path as the transistors 66 and 83 are saturated and unsaturated.

Figure 2:
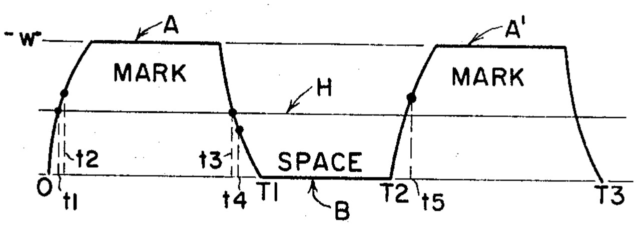
FIGURE 2 is a representation of incoming "neutral" type signals applied to one input of the relay shown in FIGURE 1.

An input series of teletypewriter pulses such as shown in FIGURE 2 are applied to the second pair of input terminals 12, 12'. That portion of the circuitry between input terminals 12, 12' and output terminals 16, 18 which is similar to corresponding portions of the circuitry between input terminals 10, 10' and output terminals 14, 16 are referenced on FIGURE 1 with numerals increased by 100 e.g. 120–129, relative to corresponding elements 20–92 in the circuits between the input terminals 10, 10' and output terminals 14, 16.

Incoming teletypewriter signals as applied to the second pair of input terminals 12, 12' are shown in FIGURE 2 as coded with data in the baudot code of the "neutral" type. FIGURE 2 illustrates a MARK signal A in the interval 0 to T1 followed by a SPACE signal in the interval T1 to T2 and another MARK signal A' in the interval T2 to T3. In the "neutral" system, the SPACE signal is represented by the flat line B at zero potential in the interval T1 to T2.

Figure 3:
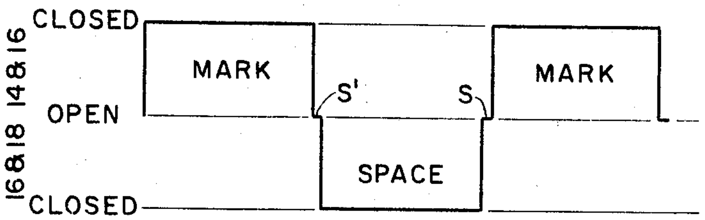
FIGURE 3 illustrates the output switching characteristic of the relay of FIGURE 1 for the incoming signals shown in FIGURE 2.

At the output side of the relay as shown in FIGURE 3, the circuit between terminals 16 and 18 will be "closed" and the circuit, between terminals 14 and 16 will be "open" for pulse A and A', of FIGURE 2 having values above the threshold H. The circuit between terminals 16 and 18 will be "open" and the circuit between terminals 14 and 16 "closed" when the input to terminals 12, 12' is below the threshold H. The threshold value H is adjustable by the value of the bias current flowing between terminals 10, 10' of the first relay input.

In order to provide that the output terminals 16 and 18 will not respond (close) to less than a selected threshold value of bias current, a winding 300 of the transformer 30 associated with oscillator 22 has one end connected by a lead 301 to a differential biasing resistor 304 associated with a saturable transistor 306 having its output collector 308 and emitter 310 electrodes connected across the input leads 132, 301 to the oscillator 122. The other end of resistor 304 is connected to the other end of winding 300 through a resistor 312, a resistor 314, a diode 316 and a lead 317. A capacitor 318 connected across resistors 314 and 312 completes the rectifier-filter circuit so that the D.C. current flowing through resistor 314 establishes base current in saturable transistor 306 proportional to bias current flowing between terminals 10, 10' of the first relay input. Input current to terminals 12, 12' flowing through resistor 304 will produce a voltage (left-hand terminal of resistor 304 being positive) which will establish a D.C. current flowing through resistor 312 that tends to cancel the base current supplied to saturable transistor 306 by resistor 314 and winding 300. The collector-to-emitter voltage of transistor 306 will remain low until input current to terminals 12, 12' reaches the product of the beta of transistor 306 and the base current of said transistor. As input current to terminals 12, 12' increases beyond this point, collector-to-emitter voltage of transistor 306 increases rapidly and provides input power to oscillator 122. Current then is provided by signal A to energize oscillator 122 by flowing from 12' to 134 to 304 to 302 to 136 of oscillator 122, to 126 to 132 to 124 to 120 to 12.

For a proper relay "double-throw-single-pole" output characteristic in a "polar" system it is necessary to assure that the two output circuits are not closed in overlapping relationship for even a brief period of time. Energization of oscillator 122 effects a closure between output terminals 16 and 18 following opening of the current path between output terminals 14 and 16.

FIGURE 3 illustrates the "closed" states between terminals 14 and 16 on one hand and 16 and 18 on the other hand. It will be assumed that the "neutral" input signals are MARK, SPACE, MARK as illustrated in FIGURE 2. The corresponding state of the output terminals are shown in FIGURE 3 for an output "polar" circuit (not shown). For proper "double-throw-single-pole" relay action, it is desirable that none of the two output circuits are closed at the same time for even a brief interval. That is to say, it is necessary and desirable to have selected brief intervals of time S and S′ as shown on FIGURE 3 during which times neither output circuit 14, 16, or 16, 18 is closed.

To assure that there is a finite interval of time S between the SPACE and MARK signals, an output winding 320 on output transformer 130 of oscillator 122 is connected to control a saturable transistor 322 having its output emitter 324 and collector 326 electrodes connected across positive and negative polarity inputs, respectively, to saturable transistor 66 so that when oscillator 122 is energized by the incoming signal A, the saturable transistor 322 short-circuits the input of and "opens" the switching transistor 66. Winding 320 controls the negative input base electrode 328 of transistor 322 by lead 330, a diode 332, a lead 334, a resistor 336 and a lead 338 while the other end of winding 320 is connected to emitter 324 by a lead 340. A resistor 342 biases the transistor 322 by connection between the emitter 324 and the base 328. A capacitor 344 is connected across the resistors 342 and 336 to complete a rectifier-filter circuit to provide the proper D.C. controlling potential for transistor 322 from the A.C. output on winding 320. A base to emitter resistor 346 is connected across emitter 70 and base 72 of switching transistor 66 to permit this transistor to withstand large collector-to-emitter voltages when cut off by interruption of input current to oscillator 22.

A second control circuit is provided to disable the saturable transistor 83 in the same manner that the saturable transistor 66 is disabled by oscillator 122. Such control circuit has elements referenced with numbers increased by 100, e.g. 400–446, relative to the reference numbers of the corresponding circuit elements, 300–346, which saturate transistor 66. The second control circuit includes a winding 420 on transformer 130 of oscillator 122 and a saturable transistor 422 having its output connected across the input of saturable transistor 83 so that when winding 420 is energized, transistor 422 saturates to disable transistor 83 by short-circuiting the latter's input. Accordingly, output windings 320 and 420 together with their associated circuitry assure that output terminals 14 and 16 are in an "open" condition when oscillator 122 is energized by an incoming informational pulse, such as A having a value greater than H.

For providing a desired minimum between the SPACE and MARK signals time delay S as shown in the "polar" output system of FIGURE 3, transistors 322 and 422 must be saturated before transistors 166 and 183 are saturated. Accordingly since windings 320, 420, 163 and 173 are simultaneously energized by signal A above H, the rise time of the R-C circuit to 166 and 183 as influenced by 163, 167′, 171, 96 and 173, 180, 179, 98, respectively, must be selected slower than the rise time of the R-C circuit to 322 and 422 as influenced by 320, 344, 342, 336 and 420, 444, 442, 436, respectively. This will assure that contacts 14 and 16 will "open" before contacts 16 and 18 will "close."

To provide a minimum time delay S′ between the "closing" of contacts 14 and 16 and the "opening" of contacts 16, 18 when a SPACE signal follows a MARK signal (see FIGURE 3), the fall time of the R-C circuit as influenced by 320, 344, 342, 336 and 420, 444, 442, 436, respectively are selected slower than the fall time of the R-C circuit as influenced by 163, 167, 171, 500 and 173, 180, 179, 98, respectively, so that transistors 166 and 183 become unsaturated before transistors 322 and 422 become unsaturated.

With the universal solid state relay of the present invention, a minimum time interval of 3 to 8 microseconds can be selected for the intervals S and S′ which represents a manyfold improvement over the usual mechanical type of polar relay.

The inputs to relay terminals 10, 10′ and 12, 12′ of FIGURE 1, may be interchanged without impairing the proper action of output terminals 14, 16 and 16, 18.

If a bias current is placed through terminals 12, 12′ while a SPACE signal B is placed on terminals 10, 10′, oscillator 122 is energized by the bias current and transistors 166 and 183 saturate to "close" contacts 16 and 18. Oscillator 22 remains unenergized. Hence, transistors 66 and 83 remain unsaturated and contacts 14 and 16 remain "open."

When signal A having a value less than H is placed on terminals 10, 10′, oscillator 22 is energized but the output on winding 300 is too little to cause transistor 306 to saturate. Hence, transistors 322 and 422 remain saturated by oscillator 122 and transistors 66 and 83 remain unsaturated. Contacts 14, 16 remain "open" and contacts 16, 18 remain "closed."

When an A signal greater than H is applied to terminals 10, 10′, oscillator 22 is adequately energized to saturate transistor 306 by winding 300. The input to oscillator 122 is shorted out and contacts 16, 18 "open." Also, the output on windings 320 and 420 of oscillator 122 collapses and transistors 322 and 422 become unsaturated to remove the short circuit from the output of energized oscillator 22 (by signal A) so that transistors 66 and 83 are driven to saturation for "closing" contacts 14, 16.

As in the case of the mechanical neutral type relay, the relative widths of the output MARK signal ($t2$ to $t4$) and the output SPACE signal ($t4$ to $t5$) is adjustable by controlling the magnitude of H with selected bias current flowing through terminals 10, 10′.

Figure 4:
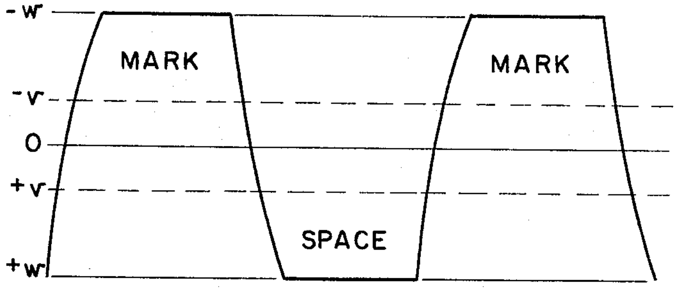
FIGURE 4 is a representation of incoming "polar" type signals applied to the input side of the relays of FIGURE 1.

When it is desired to employ "polar" type signals illustrated in FIGURE 4 as an input to the relay of FIGURE 1, terminals 10 and 12′ are connected together by a lead 5 while terminals 10′ and 12 are connected together by a lead 6, leads 5 and 6 being shown in FIGURE 1 as dashed lines. Terminals 7 and 8 connected to leads 5 and 6, respectively, provide input terminals for the "polar" signals shown in FIGURE 4.

As the input "polar" MARK signal between terminals 7 and 8 increases negatively towards $-w$, oscillator 22 will become energized at some value $-v$ to "close" output contacts 14 and 16, by saturating transistors 66 and 83. Output contacts 16 and 18 remain "open" since oscillator 122 is prevented from being energized by diode 124. Oscillator 22 becomes deenergized when the MARK signal falls below $-v$.

Also when the "polar" SPACE signal approaches $+w$, oscillator 122 becomes energized as some value $+v$ to "close" output terminals 16, 18. Oscillator 122 does not become energized as a consequence of diode 24.

In the schematic diagram of FIGURE 1, transistor 306 acts as a shunt switch to selectively short circuit the input to oscillator 122. Along with such shunt switching, there is a "positive" feed back effect since the shunt short circuit effect of transistors 322, 422 imposes a greater load upon oscillator 22 than the load presented by transistors 66, 83 in their saturated state. Therefore, when transistors 322, 422 becomes saturated, the output voltage of transformer winding 300 decreases and thus lowering the threshold H which the signal on the input terminals 12, 12′ must overcome to unsaturate transistor 306. Accordingly, the hysteresis of the system is increased resulting in delayed relay characteristics.

Figure 5:
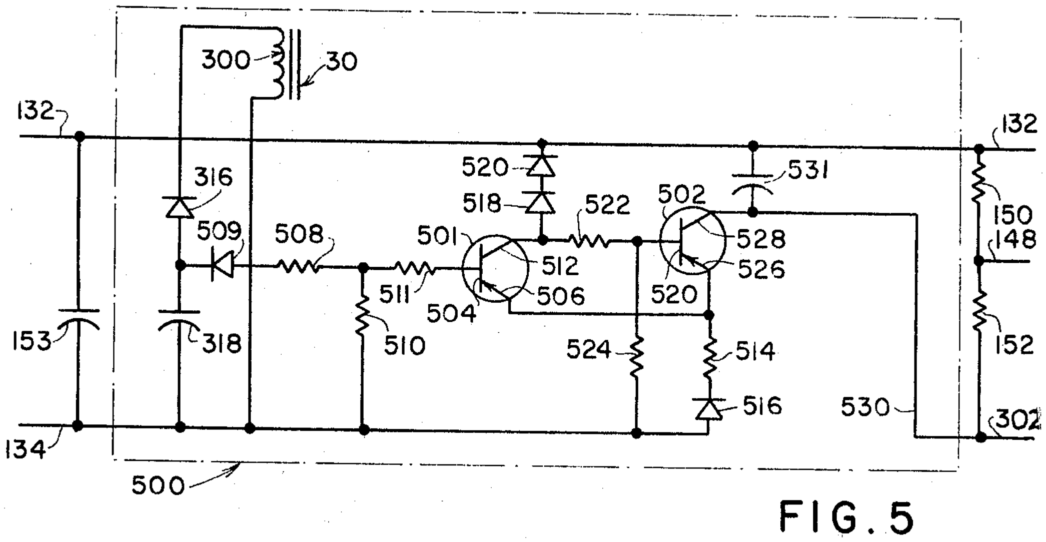
FIGURE 5 is a modification of a portion of FIGURE 1 according to the invention.

FIGURE 5 illustrates a modification of that portion of FIGURE 1 which is included in the dot-dashed line 500 for providing an improved embodiment of the invention. Transistor 306 and associated components are replaced by a Schmitt trigger circuit employing transistors 501, 502, connected so that only one transistor is saturated while the other is unsaturated. In FIGURE 5, the voltage generated in transformer winding 300 is rectified and applied between the base electrode 504 and emitter electrode 506 of transistor 501 according to the voltage division across resistors 508 and 510 for saturating transistor 501 so as to provide a low impedance path for the signals applied to terminals 12, 12′ through emitter 506 and collector 512 of transistor 501. Diodes 316 and 509 are connected in series with resistors 508 and 510 and a resistor 511 connects the common junction of 508 and 510 to base 504. However, the path of the signal current from terminal 12′ to 12 is through a resistor 514 (as well as diodes 516, 518 and 520). Accordingly, when the signal current through 12′, 12 reaches a selected threshold H of FIGURE 2, the voltage drop across resistor 514 and diode 516 is sufficient to unsaturate transistor 501. The interconnected Schmitt circuitry immediately results in a saturation of transistor 502 and the transfer of the input bias current to oscillator 122. Base electrode 520 of transistor 502 is connected to the common junction of two resistors 522, 524, the outside ends of 522, 524 being connected to collector 512 and lead 134, respectively. Emitter electrode 526 of transistor 502 is connected to emitter 506 of 501 and collector 528 of 502 is connected to lead 302 by a lead 530. A capacitor 531 is connected across leads 132 and 530. The output side of transistor 502 is connected as a "series" switch so that when it is saturated, it permits the application of the signal on terminals 12, 12′ to be applied to the input of oscillator 122. Such Schmitt circuitry results in lowering or improving the system hysteresis.

Figure 6:
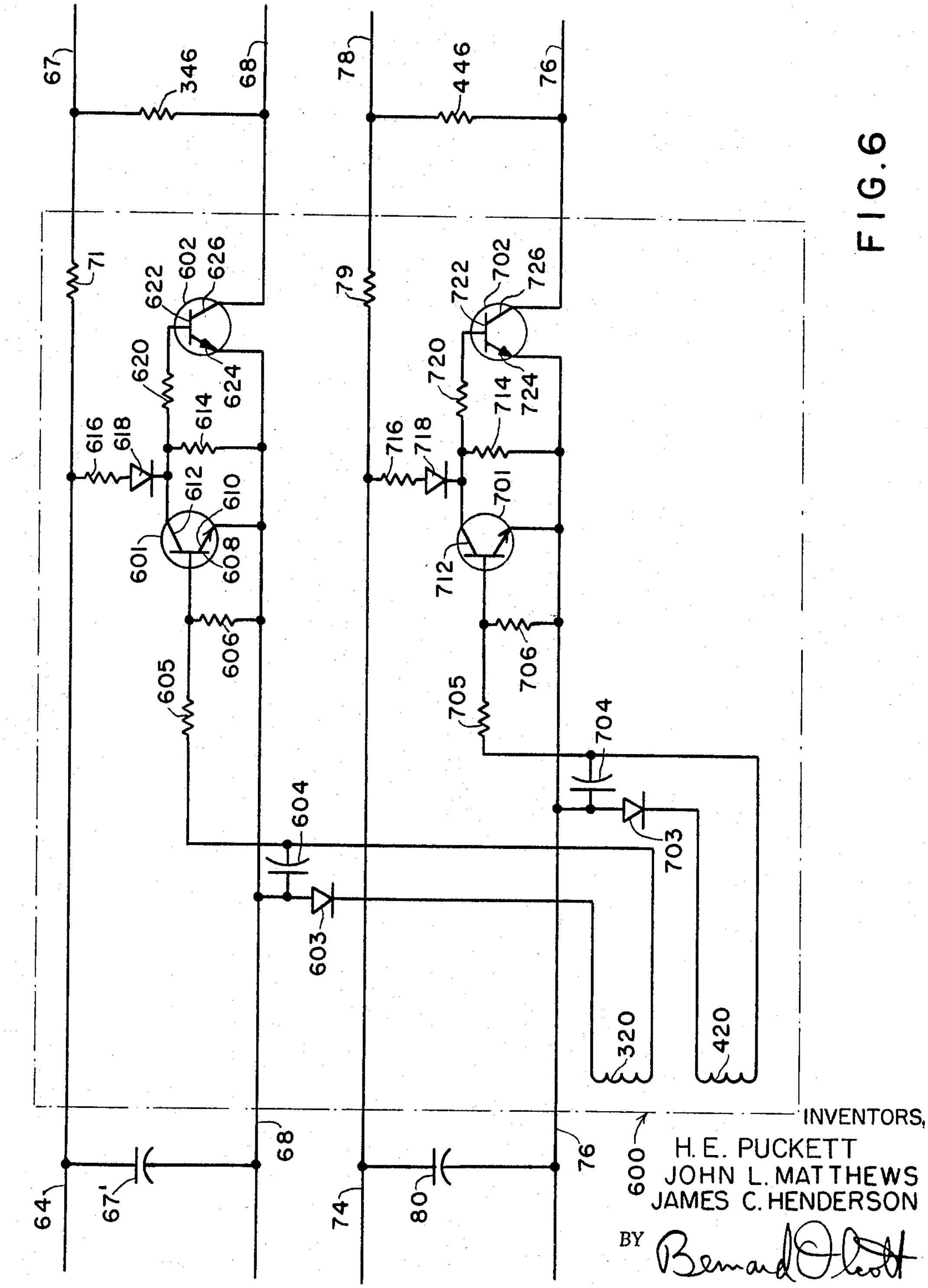
FIGURE 6 is a modification of another portion of FIGURE 1 according to the invention.

FIGURE 6 illustrates a modification of that portion of FIGURE 1 which is included within the dot-dashed line 600. In FIGURE 6, two transistors 601, 602 replace the single transistor 322 for the purpose of replacing "shunt" type short circuit control of transistor 66 with "series" type switch control provided by transistor 602. Transistor 601 maintains a constant loading upon the output of oscillator 22 and also controls the switching of transistor 602. When oscillator 122 is energized by signals on terminals 12, 12′, the voltage generated across transformer winding 320 is rectified by diode 603 and capacitor 604 for saturating transistor 601, resistors 605 and 606 providing a voltage divider to apply saturating potentials upon base electrode 608 and emitter electrode 610 of transistor 601. When transistor 601 is saturated, the low impedance circuit between emitter 610 and collector 612 short circuits the resistor 614 to render and maintain transistor 602 in its unsaturated state. When voltage is removed from transformer winding 320 by the action of either transistor 306 of FIGURE 1 or transistors 501, 502 of FIGURE 5, the saturation bias on transistor 601 is removed and saturation bias is applied to transistor 602 by output winding 63 through resistor 616, diode 618 and resistor 614, the divided voltage between 616 and 614 being applied to base electrode 622 (via resistor 620) and emitter electrode 624. Accordingly, the output of oscillator 22 saturates transistor 66, the saturated low impedance between emitter electrode 624 and collector electrode 626 acting as a "series" switch. At anytime when transistor 66 is saturated, transistor 602 is also saturated and the load is maintained constant on oscillator 22 relative to the alternate load of saturated transistor 601 by itself. Such modification in FIGURE 6 results in a reduction of system hysteresis in that the load upon oscillator 22 remains constant whether or not transistor 66 is saturated or unsaturated. As in the case of FIGURE 1, FIGURE 6 also illustrates the components by reference numbers 700–726 (including transistors 701, 702) which control transistor 83, such reference numbers being increased by 100 relative to similar components (600–626) which control transistor 66.

While there has been described and pointed out the fundamental novel features of the invention as applied to preferred embodiments, it will be understood that various omissions and substitutions and changes in the form and details of the devices illustrated and its operation may be made by those skilled in the art, without departing from the spirit of the invention. It is the intention, therefore, to be limited only as indicated by the scope of the following claims.

What I claim is:

1. A relay which comprises a first input, a second input, a first transistorized oscillator having an input coupled to said first relay input and solely energizable by a signal on said first relay input, a second transistorized oscillator having an input coupled to said second relay input and solely energizable by a signal on said second relay input, a first and second rectifier connected respectively to said first and second transistorized oscillators, a first and second filter connected respectively to said first and second rectifiers and a first and second impedance device having a high and low impedance state connected in controllable relationship to an output of said first and second filters, respectively.

2. A relay according to claim 1 including a first means controlled by the first transistorized oscillator to place said second device in a high impedance state until the input on said second relay input exceeds a predetermined threshold value and a second means controlled by said second transistorized oscillator to place said first device in a high impedance state whenever said second device is placed in a low impedance state.

3. A relay having a first and second input, either input being adapted to receive a D.C. bias voltage while the other input is adapted to receive a series of informational pulses, said relay comprising a first transistorized oscillator having an input coupled to said first relay input and solely energizable by a signal on said first relay input, a second transistorized oscillator having an input coupled to said second relay input and solely energizable by a signal on said second relay input, a first and second two state impedance device coupled respectively at their input sides in controllable relationship to the first and second transistorized oscillators, a first means controlled by said first transistorized oscillator to disable the input to the one of said devices coupled to the relay input adapted to receive said informational pulses until the magnitude of an informational pulse exceeds a predetermined D.C. voltage level responsive to a D.C. bias voltage on the other of said relay inputs, and a second means controlled by said second transistorized oscillator to disable the input to said first device when said second device is abled to receive a signal from the output of said second transistorized oscillator.

4. A relay according to claim 3 wherein said first and second relay inputs each has two terminals and said first means disables said second transistorized oscillator by short circuiting the input to said second transistorized oscillator.

5. A relay according to claim 3 wherein each device has a low and high impedance state, said first and second means controlling the impedance state of each device to be opposite to that of the other device and wherein said relay includes means delaying the changing of impedance state of each device from a high impedance to a low impedance until the other device has been changed from a low impedance to a high impedance state.

6. A relay according to claim 4 wherein said first means includes a saturable transistor coupled at its output side across the input of said second transistorized oscillator and at its input side to a biasing resistor which is coupled in differential relationship to both relay inputs.

7. A relay according to claim 4 wherein said second means includes a saturable transistor coupled at its input side to the output of said second transistorized oscillator and at its output side across the output of said first transistorized oscillator, said transistor being biased to a saturated state by the output of said second transistorized oscillator.

8. A relay which comprises a first input, a second input, a first D.C. to D.C. converter having an input coupled to said first relay input and solely energizable by a signal on said first relay input, a second D.C. to D.C. converter having an input coupled to said second relay input and solely energizable by a signal on said second relay input, a first means controlled by said first D.C. to D.C. converter to short circuit said second D.C. to D.C. converter until the signal on said second relay input exceeds a predetermined value, a two state impedance device connected in controllable relationship to an output of each of said D.C. to D.C. converters and a second means controlled by said second D.C. to D.C converter to disable the output of said first D.C. to D.C. converter whenever said second D.C. to D.C. converter is energized.

9. A relay according to claim 8 wherein said first and second relay inputs each has two terminals.

10. A relay according to claim 8 wherein each device has a low and high impedance state, the impedance state of each device being controlled by said first and second means to be opposite to that of the other device and wherein said relay includes means delaying the changing of impedance state of each device from a high impedance to a low impedance until the other device has been changed from a low impedance to a high impedance state.

11. A relay according to claim 9 wherein said first means includes a saturable transistor coupled at its output side across the input of said second D.C. to D.C. converter and at its input side to a biasing resistor which is coupled in differential relationship to both relay inputs.

12. A relay according to claim 9 wherein said second means includes a saturable transistor coupled at its input side to the output of said second D.C. to D.C. converter and at its output side across said first D.C. to D.C. converter, said transistor being biased to a non-saturated state by the output of said first D.C. to D.C. converter and to a saturated state by the output of said second D.C. to D.C. converter.

13. A relay having a first and second input which comprises a first oscillator having a first and second output, said first oscillator being coupled at its input side to said first relay input, a first and second rectifier-filter combination coupled to said first and second outputs, respectively, of said first oscillator, a first saturable transistor means coupled at its output side across said second relay input and at its input side to said second rectifier-filter combination for controlling said first saturable transistor means, a second oscillator having a first and second output, said second oscillator being coupled at its input side across the output side of said first saturable transistor means, a third and fourth rectifier-filter combination coupled across the first and second outputs, respectively, of said second oscillator, a second saturable transistor means coupled at its input side to said fourth rectifier-filter combination, a third saturable transistor means coupled at its input side to said first rectifier-filter combination, a fourth saturable transistor means coupled at its input side to said third rectifier-filter combination and first and second relay outputs coupled across the output sides of said third and fourth saturable transistors, respectively.

14. A relay adapted to receive a steady state D.C. bias voltage on one input and a series of informational pulses on another input which comprises a first D.C. to D.C. converter having an input coupled to either one relay input, a second D.C. to D.C. coverter having an input coupled to the other relay input, a first means controlled by said first D.C. to D.C. converter to disable the output of said second D.C. to D.C. converter whenever said first oscillator is energized, a two state impedance device connected in controllable relationship to an output of each of said D.C. to D.C. converters and a second means controlled by said second D.C. to D.C. converter to disable said first D.C. to D.C. converter whenever the input on said another relay input exceeds a predetermined value.

15. A relay according to claim 14 wherein said first and second relay inputs each has two terminals.

16. A relay according to claim 15 wherein each device has a low and high impedance state, the impedance state of one device normally being controlled by said first and second means to be opposite to that of the other device and wherein said relay includes means delaying the changing of impedance state of each device from a high impedance to a low impedance until the other device has been changed from a low impedance to a high impedance state.

17. A relay according to claim 14 wherein each device is a saturable transistor.

18. A relay according to claim 15 wherein said second means includes a saturable transistor coupled at its input side across the output of said second D.C. to D.C. converter and to a biasing resistor which is coupled in differential relationship to both relay inputs, said saturable transistor being coupled at its output side across the input of said first D.C. to D.C. converter, said transistor being biased to a saturated state by the output of said second D.C. to D.C. converter.

19. A relay according to claim 15 wherein said first means includes a saturable transistor coupled at its input side to the output of said first D.C. to D.C. converter and at its output side across the output of said second D.C. to D.C. converter, said transistor being biased to a saturated state by the output of said first D.C. to D.C. converter.

20. A relay according to claim 13 wherein said first saturable transistor means includes a biasing resistor differentially coupled to said second relay input and said second rectifier-filter combination.

21. A relay according to claim 13 wherein said first saturable transistor means includes a first and second transistor, means coupled to said second rectifier-filter combination and said first transistor to saturate said first transistor when said first oscillator is energized, low impedance means connecting the output side of said first transistor across the input side of said second oscillator, means connecting the output side of said second transistor in series between said second relay input and the input side of said second oscillator and means unsaturating said second transistor when said first transistor is saturated and vice versa.

22. A relay according to claim 13 wherein said second saturable transistor means includes a first and second transistor, means coupled to said fourth rectifier-filter combination and said first transistor to saturate said first transistor when said second oscillator is energized, low impedance means connecting the output side of said first transistor across the inut side of said third saturable transistor means, means connecting the output side of said second transistor in series between said first output of said first oscillator and the input side of said third saturable transistor means and means unsaturating said second transistor when said first transistor is saturated and vice versa.

References Cited by the Examiner

UNITED STATES PATENTS

| | | | |
|---|---|---|---|
| 2,478,409 | 8/1949 | Loughlin | 340—346 |
| 2,999,170 | 9/1961 | Tyler | 331—49 |
| 3,148,286 | 9/1964 | Pickering et al. | 340—346 |

OTHER REFERENCES

Pub. I, "Basic Theory and Application of Transistors," Dept. of the Army Technical Manual, TM 11–690, March 1959, pp. 218 and 219.

Pub. II, "Silicon Zener Diode and Rectifier Handbook," by Motorola, July 5, 1961, pp. 78–80.

THOMAS B. HABECKER, *Acting Primary Examiner.*

ARTHUR GAUSS, NEIL C. READ, *Examiners.*

R. H. EPSTEIN, T. A. ROBINSON, *Assistant Examiners.*